(12) United States Patent
Votruba (10) Patent No.: US 7,906,966 B1
(45) Date of Patent: Mar. 15, 2011

(54) QUADRATURE FOOT COIL ANTENNA FOR MAGNETIC RESONANCE IMAGING

(75) Inventor: Jan Votruba, Bernardston, MA (US)

(73) Assignee: Fonar Corporation, Melville, NY (US)

( * ) Notice: Subject to any disclaimer, the term of this patent is extended or adjusted under 35 U.S.C. 154(b) by 385 days.

(21) Appl. No.: 11/604,012

(22) Filed: Nov. 22, 2006

Related U.S. Application Data (63) Continuation-in-part of application No. 10/266,070, filed on Oct. 7, 2002, now abandoned.

(60) Provisional application No. 60/327,329, filed on Oct. 5, 2001, provisional application No. 60/342,832, filed on Dec. 20, 2001, provisional application No. 60/739,193, filed on Nov. 23, 2005.

(51) Int. Cl.
*G01V 3/00* (2006.01)

(52) U.S. Cl. .......................... 324/318; 324/321

(58) Field of Classification Search .......... 324/300–322; 600/407–429
See application file for complete search history.

(56) References Cited

U.S. PATENT DOCUMENTS

| | | | |
|---|---|---|---|
| 3,810,254 A | 5/1974 | Utsumi et al. |
| 4,407,292 A | 10/1983 | Edrich et al. |
| 4,411,270 A | 10/1983 | Damadian |
| 4,534,076 A | 8/1985 | Barge |
| 4,534,358 A | 8/1985 | Young |
| D283,858 S | 5/1986 | Opsvik et al. |
| 4,608,991 A | 9/1986 | Rollwitz |
| 4,613,820 A | 9/1986 | Edelstein et al. |
| 4,614,378 A | 9/1986 | Picou |
| 4,629,989 A | 12/1986 | Riehl et al. |
| 4,641,119 A | 2/1987 | Moore |
| 4,651,099 A | 3/1987 | Vinegar et al. |
| 4,663,592 A | 5/1987 | Yamaguchi et al. |
| 4,664,275 A | 5/1987 | Kasai et al. |
| 4,668,915 A | 5/1987 | Daubin et al. |
| 4,672,346 A | 6/1987 | Miyamoto et al. |
| 4,675,609 A | 6/1987 | Danby et al. |
| 4,679,022 A | 7/1987 | Miyamoto et al. |
| 4,707,663 A | 11/1987 | Minkoff et al. |

(Continued)

FOREIGN PATENT DOCUMENTS

DE  3140225 A1  4/1983

(Continued)

OTHER PUBLICATIONS

Weis et al., Simulation of the influence of magnetic field inhomogeneity and distortion correction in MR imaging, vol. 8, No. 4, p. 483-489, 1990 (Abstract).

(Continued)

*Primary Examiner* — Melissa J Koval
*Assistant Examiner* — Tiffany A Fetzner
(74) *Attorney, Agent, or Firm* — Lerner, David, Littenberg, Krumholz & Mentlik, LLP (57) ABSTRACT

An antenna for magnetic resonance imaging. The antenna preferably comprises a base, a first coil and a second coil. The first coil is mounted to the base and oriented to form an opening for receiving a foot of a patient such that the first coil extends around the foot along a lengthwise direction and defines a first coil vector that is perpendicular to the lengthwise direction. The second coil is preferably mounted to the base and oriented to extend along a widthwise direction of the foot and preferably defines a second coil vector that is parallel to the length wise direction of the foot.

18 Claims, 7 Drawing Sheets

U.S. PATENT DOCUMENTS

| | | | |
|---|---|---|---|
| 4,766,378 A | 8/1988 | Danby et al. | |
| 4,767,160 A | 8/1988 | Mengshoel et al. | |
| 4,770,182 A | 9/1988 | Damadian et al. | |
| 4,777,464 A | 10/1988 | Takabatashi et al. | |
| 4,816,765 A | 3/1989 | Boskamp | |
| 4,829,252 A | 5/1989 | Kaufman | |
| 4,866,387 A | 9/1989 | Hyde et al. | |
| 4,875,485 A | 10/1989 | Matsutani | |
| 4,908,844 A | 3/1990 | Hasegawa | |
| 4,918,388 A | 4/1990 | Mehdizadeh et al. | |
| 4,920,318 A | 4/1990 | Misic et al. | |
| 4,924,198 A | 5/1990 | Laskaris | |
| 4,943,774 A | 7/1990 | Breneman et al. | |
| 4,968,937 A | 11/1990 | Akgun | |
| 4,985,678 A | 1/1991 | Gangarosa et al. | |
| 5,008,624 A | 4/1991 | Yoshida | |
| 5,030,915 A | 7/1991 | Boskamp et al. | |
| 5,050,605 A | 9/1991 | Eydelman et al. | |
| 5,061,897 A | 10/1991 | Danby et al. | |
| 5,062,415 A | 11/1991 | Weatherby et al. | |
| 5,065,701 A | 11/1991 | Punt | |
| 5,065,761 A | 11/1991 | Pell | |
| 5,081,665 A | 1/1992 | Kostich | |
| 5,085,219 A | 2/1992 | Ortendahl et al. | |
| 5,124,651 A | 6/1992 | Danby et al. | |
| 5,134,374 A | 7/1992 | Breneman et al. | |
| 5,153,517 A | 10/1992 | Oppelt et al. | |
| 5,153,546 A | 10/1992 | Laskaris | |
| 5,155,758 A | 10/1992 | Vogl | |
| 5,162,768 A | 11/1992 | McDougall et al. | |
| 5,171,296 A | 12/1992 | Herman | |
| 5,194,810 A | 3/1993 | Breneman et al. | |
| 5,197,474 A | 3/1993 | Englund et al. | |
| 5,207,224 A | 5/1993 | Dickinson et al. | |
| 5,221,165 A | 6/1993 | Goszczynski | |
| 5,221,902 A | 6/1993 | Jones et al. | |
| 5,229,723 A | 7/1993 | Sakurai et al. | |
| 5,250,901 A | 10/1993 | Kaufman et al. | |
| 5,251,961 A | 10/1993 | Pass | |
| 5,256,971 A | 10/1993 | Boskamp | |
| 5,274,332 A | 12/1993 | Jaskolski et al. | |
| 5,277,183 A * | 1/1994 | Vij | 600/422 |
| 5,291,890 A | 3/1994 | Cline et al. | |
| 5,293,519 A | 3/1994 | Yoshino et al. | |
| 5,304,932 A | 4/1994 | Carlson | |
| 5,305,365 A | 4/1994 | Coe | |
| 5,305,749 A | 4/1994 | Li et al. | |
| 5,315,244 A | 5/1994 | Griebeler | |
| 5,315,276 A | 5/1994 | Huson et al. | |
| 5,317,297 A | 5/1994 | Kaufman et al. | |
| 5,323,113 A | 6/1994 | Cory et al. | |
| 5,349,956 A | 9/1994 | Bonutti | |
| 5,361,764 A * | 11/1994 | Reynolds et al. | 600/422 |
| 5,378,988 A | 1/1995 | Pulyer | |
| 5,382,904 A | 1/1995 | Pissanetzky | |
| 5,382,905 A | 1/1995 | Miyata et al. | |
| 5,386,447 A | 1/1995 | Siczek | |
| 5,394,087 A | 2/1995 | Molyneaux | |
| 5,412,363 A | 5/1995 | Breneman et al. | |
| 5,436,607 A | 7/1995 | Chari et al. | |
| 5,471,142 A | 11/1995 | Wang | |
| 5,473,251 A | 12/1995 | Mori | |
| 5,475,885 A | 12/1995 | Ishikawa | |
| 5,477,146 A | 12/1995 | Jones | |
| 5,490,513 A | 2/1996 | Damadian et al. | |
| 5,515,863 A | 5/1996 | Damadian | |
| 5,519,372 A | 5/1996 | Palkovich et al. | |
| 5,548,218 A | 8/1996 | Lu | |
| 5,553,777 A | 9/1996 | Lampe | |
| 5,566,681 A | 10/1996 | Manwaring et al. | |
| 5,578,925 A | 11/1996 | Molyneaux et al. | |
| 5,592,090 A | 1/1997 | Pissanetzky | |
| 5,602,479 A | 2/1997 | Srinivasan et al. | |
| 5,606,970 A | 3/1997 | Damadian | |
| 5,621,323 A | 4/1997 | Larsen | |
| 5,623,241 A | 4/1997 | Minkoff | |
| 5,640,958 A | 6/1997 | Bonutti | |
| 5,652,517 A | 7/1997 | Maki et al. | |
| 5,654,603 A | 8/1997 | Sung et al. | |
| 5,666,056 A | 9/1997 | Cuppen et al. | |
| 5,671,526 A | 9/1997 | Merlano et al. | |
| 5,680,861 A | 10/1997 | Rohling | |
| 5,682,098 A | 10/1997 | Vij | |
| 5,735,278 A | 4/1998 | Hoult et al. | |
| 5,743,264 A | 4/1998 | Bonutti | |
| 5,754,085 A | 5/1998 | Danby et al. | |
| 5,779,637 A | 7/1998 | Palkovich et al. | |
| 5,836,878 A | 11/1998 | Mock et al. | |
| 5,845,220 A | 12/1998 | Puthoff | |
| 5,862,579 A | 1/1999 | Blumberg et al. | |
| 5,929,639 A | 7/1999 | Doty | |
| 5,951,474 A | 9/1999 | Matsunaga et al. | |
| D417,085 S | 11/1999 | Kanwetz, II | |
| 5,983,424 A | 11/1999 | Naslund | |
| 5,988,173 A | 11/1999 | Scruggs | |
| 6,008,649 A | 12/1999 | Boskamp et al. | |
| 6,011,396 A | 1/2000 | Eckels et al. | |
| 6,014,070 A | 1/2000 | Danby et al. | |
| 6,023,165 A | 2/2000 | Damadian et al. | |
| 6,029,082 A * | 2/2000 | Srinivasan et al. | 600/422 |
| 6,075,364 A | 6/2000 | Damadian et al. | |
| 6,094,116 A | 7/2000 | Tai et al. | |
| 6,122,541 A | 9/2000 | Cosman et al. | |
| 6,137,291 A * | 10/2000 | Szumowski et al. | 324/318 |
| 6,138,302 A | 10/2000 | Sashin et al. | |
| 6,141,579 A | 10/2000 | Bonutti | |
| 6,144,203 A | 11/2000 | Richard et al. | |
| 6,144,204 A | 11/2000 | Sementchenko | |
| 6,150,819 A | 11/2000 | Laskaris et al. | |
| 6,150,820 A | 11/2000 | Damadian et al. | |
| 6,201,394 B1 | 3/2001 | Danby et al. | |
| 6,208,144 B1 | 3/2001 | McGinley et al. | |
| 6,226,856 B1 | 5/2001 | Kazama et al. | |
| 6,246,239 B1 | 6/2001 | Krogmann et al. | |
| 6,246,900 B1 | 6/2001 | Cosman et al. | |
| 6,249,121 B1 | 6/2001 | Boskamp et al. | |
| 6,249,695 B1 | 6/2001 | Damadian | |
| 6,285,188 B1 | 9/2001 | Sakakura et al. | |
| 6,344,745 B1 | 2/2002 | Reisker et al. | |
| 6,346,814 B1 | 2/2002 | Carrozzi et al. | |
| 6,357,066 B1 | 3/2002 | Pierce | |
| 6,369,571 B1 | 4/2002 | Damadian et al. | |
| 6,377,044 B1 | 4/2002 | Burl et al. | |
| 6,377,836 B1 | 4/2002 | Arakawa et al. | |
| 6,385,481 B2 | 5/2002 | Nose et al. | |
| 6,404,199 B1 | 6/2002 | Fujita et al. | |
| 6,411,088 B1 | 6/2002 | Kuth et al. | |
| 6,414,490 B1 | 7/2002 | Damadian et al. | |
| 6,424,854 B2 | 7/2002 | Hayashi et al. | |
| 6,456,075 B1 | 9/2002 | Damadian et al. | |
| 6,504,371 B1 | 1/2003 | Damadian et al. | |
| 6,515,479 B1 | 2/2003 | Arz et al. | |
| 6,549,800 B1 | 4/2003 | Atalar et al. | |
| 6,591,128 B1 | 7/2003 | Wu et al. | |
| 6,639,406 B1 | 10/2003 | Boskamp et al. | |
| 6,650,926 B1 | 11/2003 | Chan et al. | |
| 6,677,753 B1 * | 1/2004 | Danby et al. | 324/318 |
| 6,750,653 B1 * | 6/2004 | Zou et al. | 324/318 |
| 6,788,057 B1 * | 9/2004 | Petropoulos et al. | 324/318 |
| 6,792,257 B2 | 9/2004 | Rabe et al. | |
| 6,801,038 B2 | 10/2004 | Carrozzi et al. | |
| 6,806,711 B2 | 10/2004 | Reykowski | |
| 6,822,447 B1 * | 11/2004 | Yamagata | 324/318 |
| 6,828,792 B1 * | 12/2004 | Danby et al. | 324/318 |
| 6,831,460 B2 | 12/2004 | Reisker et al. | |
| 6,850,064 B1 | 2/2005 | Srinivasan | |
| 6,882,149 B2 | 4/2005 | Nitz et al. | |
| 6,882,877 B2 | 4/2005 | Bonutti | |
| 6,894,495 B2 | 5/2005 | Kan | |
| 6,954,069 B2 | 10/2005 | Harvey et al. | |
| 6,980,002 B1 | 12/2005 | Petropoulos et al. | |
| 6,992,486 B2 * | 1/2006 | Srinivasan | 324/318 |
| 7,002,341 B2 | 2/2006 | Baudenbacher et al. | |
| 7,046,006 B2 | 5/2006 | Creemers | |
| 7,049,819 B2 | 5/2006 | Chan et al. | |
| 7,221,161 B2 | 5/2007 | Fujita et al. | |
| 7,227,360 B2 * | 6/2007 | Jevtic et al. | 324/318 |

| | | |
|---|---|---|
| 7,245,127 B2 | 7/2007 | Feng et al. |
| 7,348,778 B2 | 3/2008 | Chu et al. |
| 7,474,098 B2 | 1/2009 | King |
| 7,545,144 B2 * | 6/2009 | Guan et al. ............ 324/318 |
| 7,619,412 B2 * | 11/2009 | Okamoto et al. ......... 324/318 |
| 2001/0029330 A1 | 10/2001 | Nose et al. |
| 2002/0013524 A1 | 1/2002 | Hayashi et al. |
| 2002/0032927 A1 | 3/2002 | Dinkler |
| 2002/0101241 A1 | 8/2002 | Chui |
| 2002/0123681 A1 | 9/2002 | Zuk et al. |
| 2002/0196021 A1 | 12/2002 | Wang |
| 2003/0071622 A1 | 4/2003 | Reisker et al. |
| 2003/0204136 A1 * | 10/2003 | Green et al. ............ 600/415 |
| 2003/0210049 A1 | 11/2003 | Boskamp et al. |
| 2004/0015074 A1 * | 1/2004 | Srinivasan ............... 600/422 |
| 2004/0030241 A1 | 2/2004 | Green et al. |
| 2004/0075437 A1 * | 4/2004 | Srinivasan ............... 324/318 |
| 2004/0220469 A1 * | 11/2004 | Jevtic et al. ............. 600/422 |
| 2006/0267588 A1 * | 11/2006 | Okamoto et al. ......... 324/318 |
| 2009/0121715 A1 * | 5/2009 | Guan et al. .............. 324/318 |

FOREIGN PATENT DOCUMENTS

| | | |
|---|---|---|
| JP | 4-332531 | 11/1992 |
| JP | 62-26052 | 8/1994 |
| JP | 08-050843 | 2/1996 |

OTHER PUBLICATIONS

"The design and construction of high field-uniformity permanent magnet system for MRI" Feng, Z.X.; Jiang, X.H.;Han, S.; Magnetics, IEEE Transactions on vol. 28, Issue 1, Jan. 1992 pp. 641-643.

Guclu et al., A method for Preamplifier-Decoupling Improvement in Quadrature Phased-Array Coils, Journal of Magnetic Resonance Imaging, 19:255-258, 2004.

Feng, et al., A New Phased Array Spine Coil for Vertical Field MRI System, Proc. Intl. Soc. Mag. Reson. Med. 11, 2003.

* cited by examiner

QUADRATURE FOOT COIL ANTENNA FOR MAGNETIC RESONANCE IMAGING

CROSS-REFERENCE TO RELATED APPLICATIONS

The present application is a continuation-in-part of U.S. application Ser. No. 10/266,070, filed Oct. 7, 2002, which claims the benefit of U.S. Provisional Application Nos. 60/327,329, filed Oct. 5, 2001 and 60/342,382, filed Dec. 20, 2001, the disclosures of which are incorporated herein by reference. This application also claims the benefit of U.S. Provisional Application No. 60/739,193, filed Nov. 23, 2005, the disclosure of which is incorporated herein by reference.

BACKGROUND OF THE INVENTION

The present application relates to magnetic resonance imaging (MRI) apparatus and methods for using such apparatus in imaging procedures.

In magnetic resonance imaging, an object to be imaged as, for example, a body of a human subject is exposed to a strong, substantially constant static magnetic field. The static magnetic field causes the spin vectors of certain atomic nuclei within the body to randomly rotate or "precess" around an axis parallel to the direction of the static magnetic field. Radio frequency excitation energy is applied to the body, and this energy causes the nuclei to "precess" in phase and in an excited state. As the precessing atomic nuclei relax, weak radio frequency signals are emitted; such radio frequency signals are referred to herein as magnetic resonance signals.

Different tissues produce different signal characteristics. Furthermore, relaxation times are the dominant factor in determining signal strength. In addition, tissues having a high density of certain nuclei will produce stronger signals than tissues with a low density of such nuclei. Relatively small gradients in the magnetic field are superimposed on the static magnetic field at various times during the process so that magnetic resonance signals from different portions of a patient's body differ in phase and/or frequency. If the process is repeated numerous times using different combinations of gradients, the signals from the various repetitions together provide enough information to form a map of signal characteristics versus location within the body. Such a map can be reconstructed by conventional techniques known in the magnetic resonance imaging art, and can be displayed as a pictorial image of the tissues as known in the art.

The magnetic resonance imaging technique offers numerous advantages over other imaging techniques. MRI does not expose either the patient or medical personnel to X-rays and offers important safety advantages. Also, magnetic resonance imaging can obtain images of soft tissues and other features within the body which are not readily visualized using other imaging techniques. Accordingly, magnetic resonance imaging has been widely adopted in the medical and allied arts.

Several factors impose physical constraints in the positioning of patients and ancillary equipment in magnetic resonance imaging. Many MRI magnets use one or more solenoidal superconducting coils to provide the static magnetic field arranged so that the patient is disposed within a small tube running through the center of the magnet. The magnet and tube typically extend along a horizontal axis, so that the long axis or head-to-toe axis of the patient's body must be in a horizontal position during the procedure. Moreover, equipment of this type provides a claustrophobic environment for the patient. Iron core magnets have been built to provide a more open environment for the patient. These magnets typically have a ferromagnetic frame with a pair of ferromagnetic poles disposed one over the other along a vertical pole axis with a gap between them for receiving the patient. The frame includes ferromagnetic flux return members such as plates or columns extending vertically outside of the patient-receiving gap. A magnetic field is provided by permanent magnets or electromagnetic coils associated with the frame. A magnet of this type can be designed to provide a more open environment for the patient. However, it is still generally required for the patient to lie with his or her long axis horizontal.

Recently, ferromagnetic frame magnets having horizontal pole axes have been developed. As disclosed, for example, in commonly assigned U.S. Pat. Nos. 6,414,490 and 6,677,753, the disclosures of which are incorporated by reference herein, a magnet having poles spaced apart from one another along a horizontal axis provides a horizontally oriented magnetic field within a patient-receiving gap between the poles. Such a magnet can be used with a patient positioning device including elevation and tilt mechanisms to provide extraordinary versatility in patient positioning. For example, where the patient positioning device includes a bed or similar device for supporting the patient in a recumbent position, the bed can be tilted and/or elevated so as to image the patient in essentially any position between a fully standing position and a fully recumbent position, and can be elevated so that essentially any portion of the patient's anatomy is disposed within the gap in an optimum position for imaging. As further disclosed in the aforesaid patents, the patient positioning device may include additional elements such as a platform projecting from the bed to support the patient when the bed is tilted towards a standing orientation. Still other patient supporting devices can be used in place of a bed in a system of this type. For example, a seat may be used to support a patient in a sitting position. Thus, magnets of this type provide extraordinary versatility in imaging.

Another physical constraint on MRI imaging has been posed by the requirements for RF antennas to transmit the RF excitation energy and to receive the magnetic resonance signals from the patient. The antenna that receives the signals is preferably positioned in close proximity to the portion of the patient's body that is to be imaged so as to maximize the signal-to-noise ratio and improve reception of the weak magnetic resonance signals. The antenna that applies RF excitation energy can be positioned in a similar location to maximize efficiency of the applied RF energy. In some cases, the same antenna is used to apply RF excitation energy and to receive the magnetic resonance signals at different times during the process. However, it is often desirable to provide two separate antennas for this purpose.

The antennas are typically formed as one or more loops of electrically conductive material. Such a loop antenna must be positioned so that the conductor constituting the loop extends along an imaginary plane or surface having a normal vector transverse to the direction of the static magnetic field. Stated another way, the antenna must be arranged to transmit or receive electromagnetic fields in a direction perpendicular to the direction of the static magnetic field if it is to interact with the precessing atomic nuclei. This requirement has further limited available antenna configurations and techniques. For example, in a vertical-field magnet such as a ferromagnetic frame magnet having a vertical pole axis, it is impossible to use a loop antenna with the loop disposed generally in a horizontal plane below the body of a recumbent patient. Such an antenna has a normal vector which is vertical and hence parallel to the direction of the static magnetic field. A loop antenna which encircles the patient with its normal vector extending horizontally can be employed. Also, planar or saddle-shaped loops extending in generally vertical planes or surfaces, and having normal vectors in the horizontal direction transverse to the long axis of the patient can be positioned on opposite sides of the patient. However, these antenna configurations do not provide optimum signal-to-noise ratios in some procedures.

The signal-to-noise ratio of the magnetic resonance or NMR signal may be further increased by employing a coil that is sensitive to energy along both a pair of mutually perpendicular axes. This technique is generally referred to as quadrature detection and the signals collected are termed quadrature signals. Coils employing this geometry are typically referred to as quadrature coils. The outputs of the quadrature coils pairs are combined so as to increase the strength of the received signal according to the sum of the output signals corrected for phase shifts from the coils. The strength of the uncorrelated noise component of the signals, however, will increase only according to the square root of the sum of the squares of the noise components. As a result, the net signal-to-noise ratio of the combined quadrature signal increases by approximately $\sqrt{2}$ over the signal-to-noise ratio of the individual signal.

Of utility then are coil geometries that are placeable proximate the region of interest and that employ quadrature detection.

SUMMARY OF THE INVENTION

An aspect of the present invention comprises an antenna for magnetic resonance imaging. The antenna preferably compromises a base, a first coil and a second coil. The first coil is preferably mounted to the base and oriented to form an opening for receiving a foot of a patient such that the first coil extends around the foot along a lengthwise direction and defines a first coil vector that is perpendicular to the lengthwise direction. The second coil is preferably mounted to the base and oriented to extend along a widthwise direction of the foot and preferably defines a second coil vector that is parallel to the length wise direction of the foot.

In accordance with this aspect of the present invention, the base may include an extended portion for supporting the other foot of the patient.

Further in accordance with this aspect of the present invention, the first coil may comprise one or more conductors that preferably include at least two turns disposed above each other along the direction of the first coil vector. In addition, each turn desirably extends around the foot of the patient in the lengthwise direction.

Further still in accordance with this aspect of the present invention, the second coil preferably comprises one or more conductors having at least three turns, each turn being mounted to the base. In addition, at least one of the turns is preferably detachably mounted to the base to allow for insertion of the patient's foot into the opening.

Further in accordance with this aspect of the present invention, the base preferably comprises a planar surface having a pair of lateral edges disposed opposite each other along the lengthwise direction. In addition, two of the at least three turns of the second conductor are respectively mounted proximate each of the lateral edges.

Further still in accordance with this aspect of the present invention, a third turn is preferably mounted on the base between the two turns mounted proximate the lateral edges. Preferably, the third turn is detachably mounted to the base to allow for insertion of the patient's foot into the opening.

In another aspect, the present invention comprises a quadrature coil antenna assembly. The assembly preferably comprises a base having a planar surface that defines a pair of lateral edges separated along an axial direction and extending in a first direction substantially perpendicular to the axial direction. The assembly further comprises a first coil supported on the surface of the base and arranged to form an oval that defines an area on the surface for positioning a sole of a patient's foot or footwear, the first coil defining a first coil vector that is perpendicular to the axial direction and the first direction.

The assembly may further desirably comprise a second coil supported on the surface of the base, the second coil including a first section that is mounted on the base proximate an end defined by the oval, a second section that is mounted on the base proximate another end defined by the oval, and a third section that is mountable upon the base between the first and second sections, the second coil defining a coil vector that is perpendicular to the first coil vector.

Further in accordance with this aspect of the present invention, the first, second and third sections comprise a housing for one or more conductors that form the second coil. In addition, the first and second sections preferably project from the base and each include a curved portion that respectively extends around the heel and toe of the patient's foot when positioned in the oval form by the first coil.

Further in accordance with this aspect of the present invention, the oval formed by the first coil preferably projects from the surface of the base. Further still, the first coil preferably comprises a first section projecting from the base and a section mounted on top of the first section.

In yet another aspect, the present invention may comprise a system for magnetic resonance imaging. The system preferably comprises: a magnet defining a patient-receiving space and having a static magnetic field with a field vector in a substantially horizontal direction; a patient support positionable within the patient-receiving space and pivotable about a horizontal pivot axis that is parallel to the field vector; a quadrature coil antenna assembly adapted to be supported by the patient support and including a base, a first coil having a first coil vector that is perpendicular to the field vector when the assembly and patient support are positioned in the patient-receiving space and a second coil vector that is perpendicular to the first coil vector and the field vector when the assembly and patient support is positioned in the patient-receiving space, and wherein the first and second coils are arranged on the base to define a volume for receiving a magnetic resonance signal from a patient's foot positioned on the base.

In accordance with this aspect of the present invention, the first coil preferably comprises one or more conductors having at least two turns disposed above each other along the direction of the first coil vector and that extends around the length of the patient's foot.

Further in accordance with this aspect of the present invention, the second coil may desirably include a third section that is mounted on the base proximate a first end defined by the receiving volume, a second section that is mounted on the base approximate a second end defined by the receiving volume, and a third section that is mountable on the base between the first and the second sections. Preferably, the first and second sections project from the base and each include a curved portion that respectively extends around the heel and toe area of the patient's foot when positioned within the volume form of the coils.

DETAILED DESCRIPTION

Figure 1:
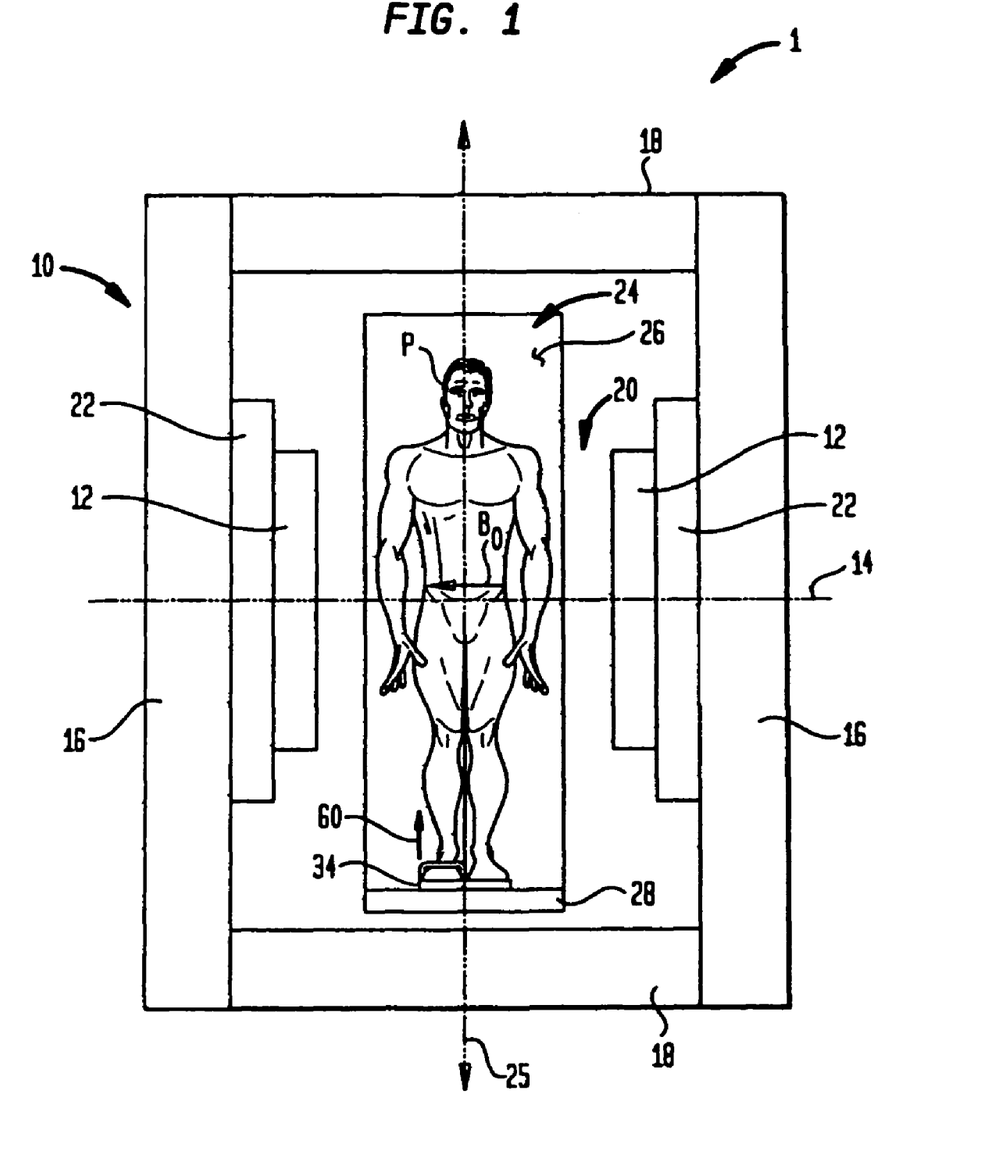
FIG. 1 illustrates a front view of a magnetic resonance imaging system in accordance with an aspect of the present invention.
Figure 2:
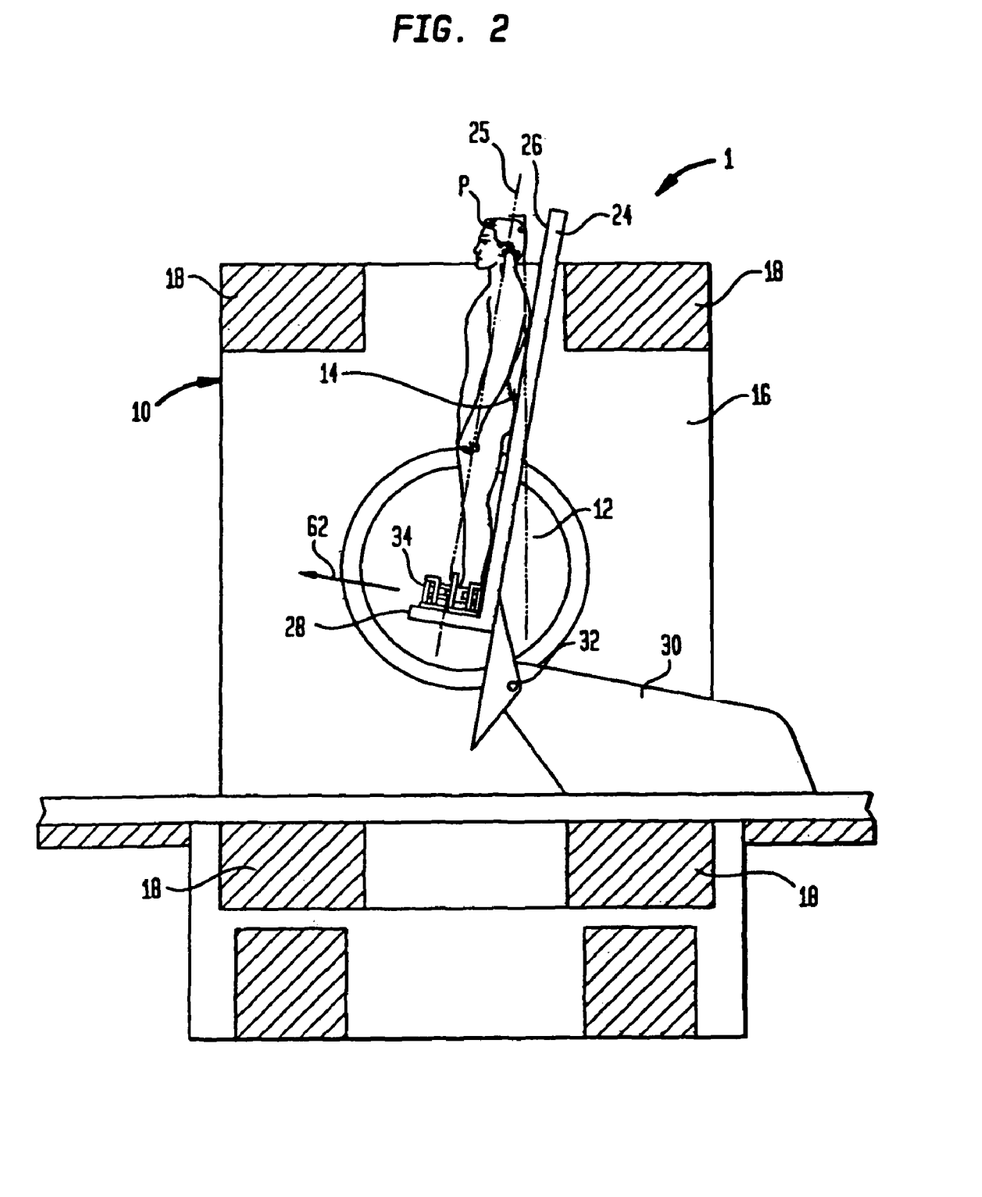
FIG. 2 Illustrates a side view of a magnetic resonance imaging system in accordance with an aspect of the present invention.

Turning to FIGS. 1 and 2, there is illustrated an system 1 according to an aspect of the present invention. The system 1 includes a static field magnet having a frame 10 including a pair of poles 12 spaced apart from one another along a horizontal pole axis 14. Frame 10 further includes flux conducting and return members that, in the particular embodiment illustrated, include a pair of sidewalls 16 and columns 18 extending between the sidewalls 16. The particular frame depicted in FIGS. 1 and 2 is generally in accordance with the aforementioned U.S. Pat. No. 6,677,753, (hereinafter "the '753 patent") although other configurations can be employed. The opposed poles define a patient-receiving space or gap 20 between them. The magnet further includes a source of magnetic flux adapted to be directed into and out of the gap through poles 12 so as to form a static magnetic field having a field vector $B_0$ in the horizontal direction, parallel to pole axis 14. In the particular embodiment illustrated, the flux source includes a pair of electromagnet coils 22 encircling poles 12. These coils may be superconductive or resistive coils. Alternate flux sources such as coils disposed at other locations along the ferromagnetic frame and permanent magnets also may be employed. Moreover, this invention may also be used in magnets that do not include a magnetic frame or use poles.

The system further includes a patient support assembly including a patient support apparatus or bed 24 defining an elongated patient supporting surface 26 having a lengthwise axis 25 and a platform 28 projecting from the supporting surface at a foot end of the bed. In addition, a seat may be mounted to supporting surface 26 to allow a patient to be positioned in a sitting position. The patient supporting assembly further includes a frame 30. The apparatus 24 is pivotably mounted to the frame 30 for movement about a generally horizontal pivot axis 32. Pivot axis 32 is substantially parallel to pole axis 14. Apparatus 24 can pivot between an upright position in which the lengthwise direction over the bed extends generally vertically as seen in FIG. 2 and a fully horizontal position shown in FIG. 3, in which the lengthwise direction of the apparatus 24 extends horizontally. As further described in the '753 patent, apparatus 24 also may be mounted for vertical motion relative to frame 30 and hence relative to the static field magnet 10. Moreover, frame 30 can be mounted for horizontal movement relative to the static field magnet. Appropriate actuators and control devices (not shown) are provided for moving the bed and for moving support frame 30.

Figure 3:
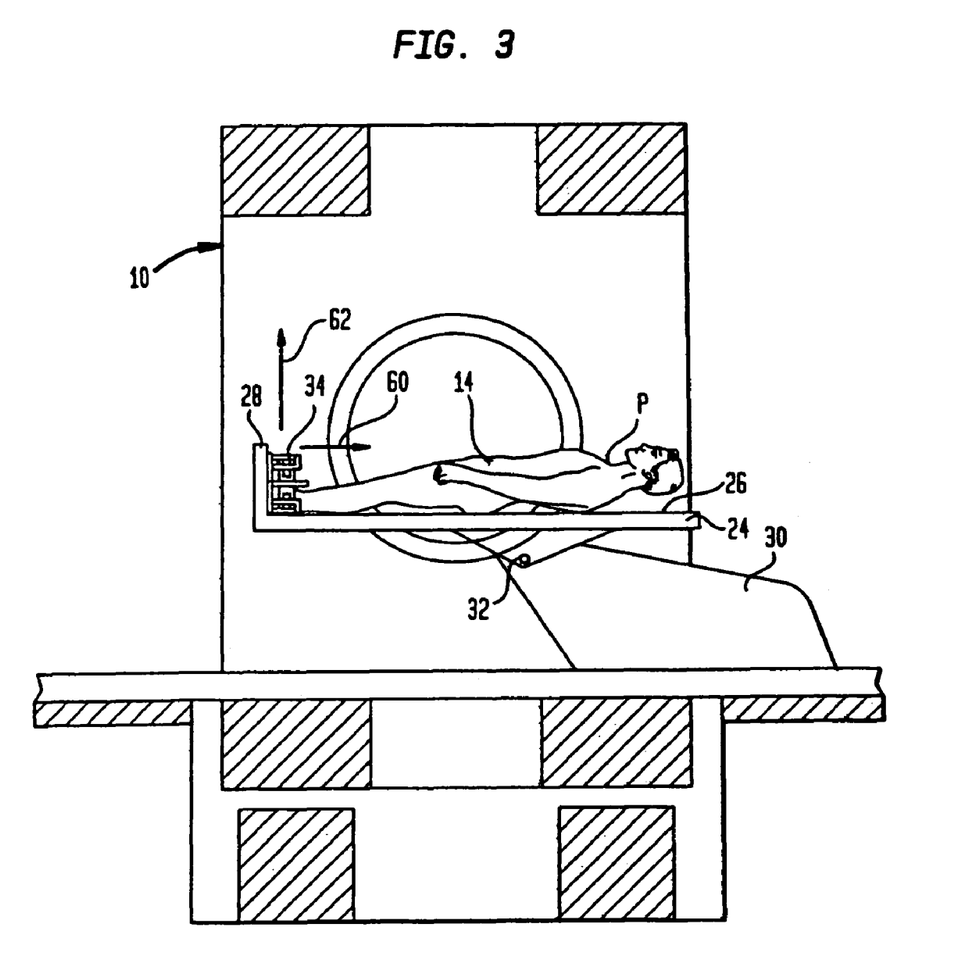
FIG. 3 Illustrates a side view of a magnetic resonance imaging system in accordance with an aspect of the present invention.
Figure 4:
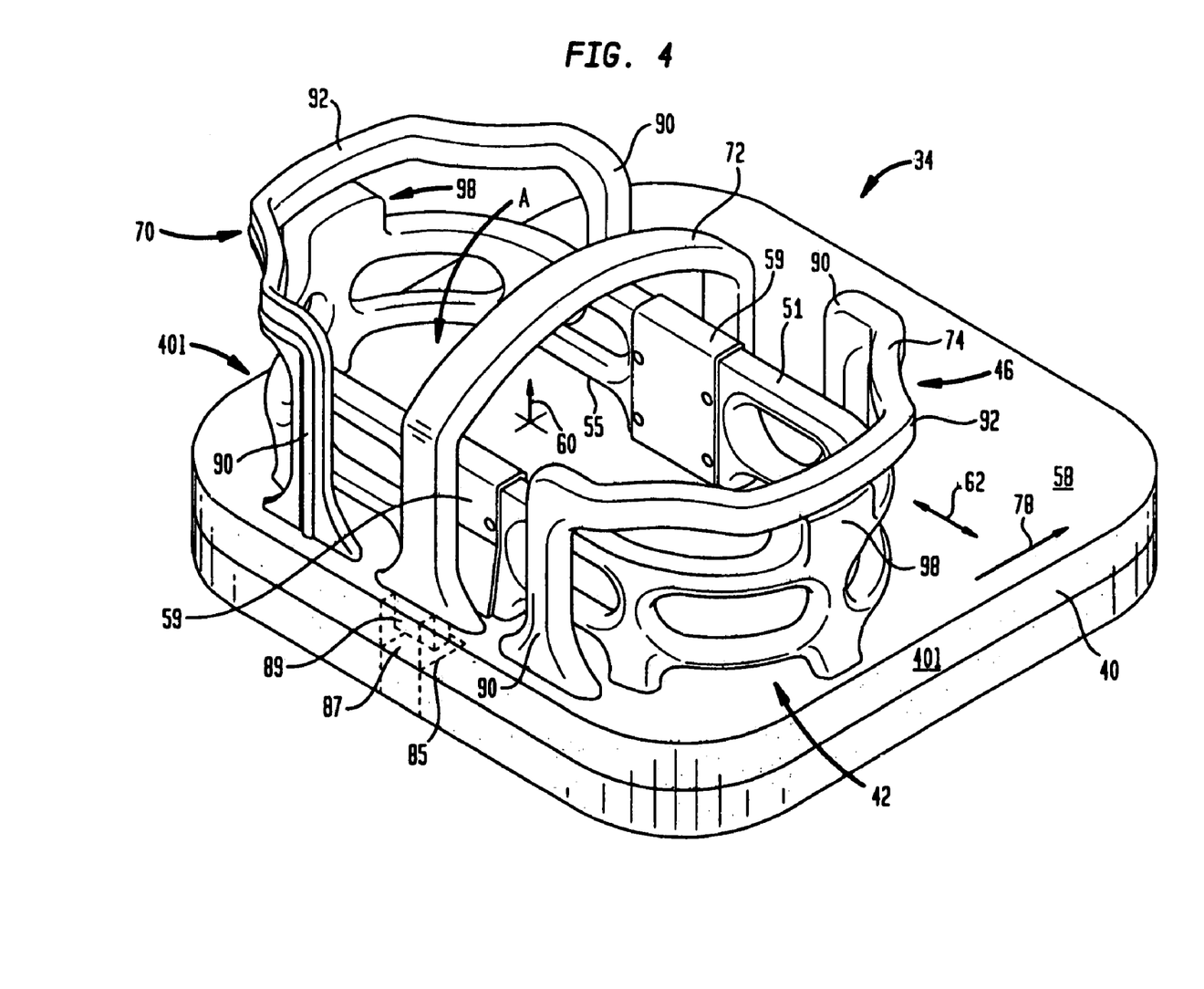
FIG. 4 Illustrates a quadrature foot coil assembly in accordance with an aspect of the present invention.

As is also shown in FIGS. 1, 2 and 3, the system preferably includes a foot coil 34 that is supported by the patient support 24 proximate the platform 28. An embodiment of a foot coil 34 is shown in FIG. 4 and discussed in greater detail below. In FIGS. 1 and 2, the patient P is shown standing on the foot coil 34, which allows for imaging of the foot and ankle area in a weight bearing position. On the other hand, as shown in FIG. 3, imaging may be performed with the patient in a recumbent position by pivoting the apparatus 24 about the pivot axis 32.

In either case, i.e., a standing or recumbent patient, the apparatus 24 may be translated so that the patient's foot can be located in the magnet's imaging volume. This additional versatility coupled with the locality of the coils proximate the patient's foot allows for improvement in the images obtained. Thus, although in principle a foot may be scanned in any coil able to accommodate it, problems associated with immobilization often result in blurry images with artifacts. We have found that the use of a localized quadrature foot coil of the type discussed below typically enhances the images that may be obtained. In addition to providing immobilization, the coil geometry and electrical circuitry of the coils describe below enhance the signal-to-noise performance and illumination uniformity of the foot scanned.

FIG. 4 illustrates such a foot coil assembly 34 in accordance with an aspect of the present invention. As seen in FIG. 4, the foot coil 34 includes a base 40 onto which first coil 42 and second coil 46 are mounted. The first coil 42 includes a first loop or turn 51 and a second loop or turn 55. As shown in FIG. 4, each loop 51, 55 includes a housing or frame structure for a conductor or cable that is used to receive magnetic resonance signals that are generated as previously discussed. The details of the electrical interconnections of the conductors located in the housing are discussed in greater detail below.

Each loop 51, 55 is shape to define an area A for receiving a foot of a patient. In particular, each loop includes a pair of opposing sides and curved sections that form a closed loop that is preferably oval in the shape. The size of the loop may be formed to accommodate different foot sizes, although we have found that a single loop may be designed to accommodate almost all foot sizes, which avoids the need for customization and coils of various sizes. The first loop 51 is mounted atop the second loop 55, which is mounted to the planar surface 58 of the base 40. Together, the loops form an oval frame that includes covers 59. The covers 59 are preferably screwed to the other frame member (e.g., ribs) and provide a convenient connection point and location for housing other circuit elements associated with the coils.

The covers 59 also provide a convenient access point for adjusting the oval coil relative to the second coil to adjust the mutual inductance point between the coils to be substantially 0 or the minimum inductance point. In particular, the oval coil is preferably connected to two more locking screws that hold the coils in place. With these screws loosened, the coils may then be adjusted along the axial direction 62 to determine the preferred mutual inductance point.

In a preferred embodiment, the first loop 51 is mounted above the second loop 55 by approximately two inches. The loops 51, 55 each define a coil vector 60 that is perpendicular to the planar surface 58 and a lengthwise or axial direction 62. In addition, when the assembly 34 is supported by the patient support apparatus 24 (see FIGS. 1, 2, 3), the coil vector 60 is parallel to the lengthwise or longitudinal axis 25 of the patient and perpendicular to the field vector $B_0$.

The second coil 46 is formed by sections or turns 70, 72 and 74 that surround the foot in the coronal plane. Each section is magnetically decoupled from the first coil 42. As shown, each of the sections 70, 72, 74 are mounted to the base 40 outside the area A formed by the first coil 42 and are formed so as to arch over the foot in the widthwise or lateral direction 78. Each section comprises a frame or housing for one or more conductors, as is discussed in further detail below. The center section 72 is preferably U-shaped and removable so as to allow a patient to insert a foot into the area A. In particular, as shown at detail 85, the base may be formed with openings 87 (only one shown) for receiving connectors 89 included at the ends of the center section 72. The connectors 89 include electrical contacts for connecting to the rest of the turns 70, 74 inside the base 40. The connectors 89 may be formed with latches that mate with notches formed on the side walls of the openings 87 to better secure the center section 72 to the base 40. In this case, the center section 72 may need to be equipped with a release tab or button to disengage the latches from the notches. Alternatively, the center section 72 may just slide in and out of the openings 87 and be held in place by a snuggly fitting into the opening 87.

The end sections 70, 74 are similar in shape and located at opposite ends of the first coil 42 near the lateral edges $40_1$ of the base. Each end section 70, 74 includes legs that project from the planar surface 58 into ribbed portions 92 that extends above the curved sections. The ribbed portions 92 are supported above the first coil 42 by support members 98. Given the geometrical/electrical sensitivity of the end sections 70, 74 of the second coil, the support members 98 assist in avoiding mechanical deformation that may occur if a patient steps on these sections.

The second coil 42 defines a coil vector that is parallel to the lengthwise or axial direction 62. AS shown FIGS. 1, 2 and 3, when the assembly 34 is supported by the patient support apparatus 24, the coil vector 62 is parallel to the lengthwise or longitudinal axis 25 of the patient and perpendicular to the field vector $B_0$. In addition, as the coil vectors of both the first coil and second coil are perpendicular to each other, the assembly 34 comprises a quadrature coil assembly that increases the signal-to-noise ratio by approximately $\sqrt{2}$ over the signal-to-noise ratio of the individual signal. In addition, given the versatility of the system in allowing for a patient's foot to be preferably positioned in the isocenter of the magnet, i.e., the center of imaging volume, the foot or ankle region may be imaged without blurriness and other artifacts typically present in conventional imaging systems.

In the embodiment shown in FIG. 4, the coil 34 includes a wider base to accommodate the other foot of the patient. In this case, the coil assembly 34 may be turned 180° to perform scanning of the other foot. The base 40 is preferably made as narrow as possible to allow it to be positioned within the imaging volume and preferably as close to the isocenter of the magnet as the non-scanned foot allows. In another embodiment, the base of assembly 34 is made as narrow as possible to accommodate the first and second coils, 42, 46 and a separate spacer is used to support the foot that is not being scanned. In accordance with this latter embodiment, there is no need to rotate the coil to image either foot.

Figure 5A:
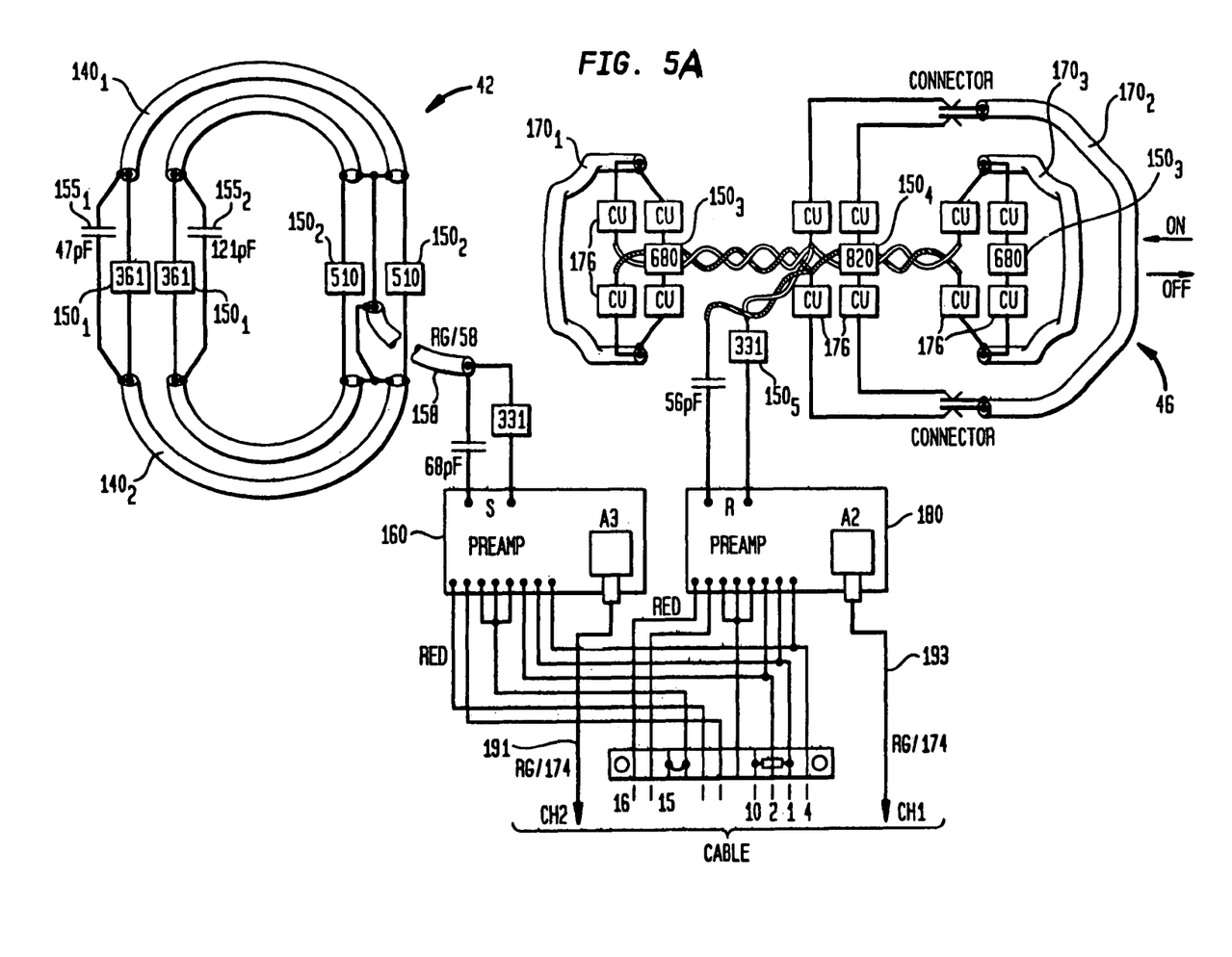
FIG. 5A illustrates a circuit diagram of a quadrature foot coil in accordance with an aspect of the present invention.

Turning now to FIG. 5A, there is illustrated a circuit diagram that shows the interconnection between the first and second coils 42, 46 that comprise the assembly 34. As shown, the first coil 42 comprises a pair of cables or coils 140 that are connected through decoupling circuits 150 and capacitors 155. As shown, in the preferred embodiment, the decoupling circuits provide electrical isolation from the RF transmitter of the scanner and function as capacitors having the values shown in the blocks. The signals from each of the cables 140 are summed and provided through coupling cable 158 to an amplifier 160.

The second coil 46 comprises turns or sections $170_1$, $170_2$ and $170_3$. Section $170_2$ comprises center section 72 in FIG. 4 and includes the connectors that allow it to be removed/connected from/to the assembly as discussed above. The end sections 70, 74 may be either sections $170_1$ or $170_3$. As shown, signals received by the sections $170_1$, $170_2$ and $170_3$ are fed through decoupling circuits and copper strips (CU) to amplifier 180.

The signals (191, 193) from amplifier 160 and 180 are then combined to achieve the signal to ratio improvement. Since the quadrature orientation of the coils introduce a 90° phase difference between the detected signals, the signals must also be shifted so as to be phase aligned so that the amplitudes of the signals add.

In another embodiment the foot coils discussed herein a comprise a trans-receive system. Here, the main transmitter is inactive and the foot coil is switched into NMR receiving mode using circuitry comprising active PIN diode switches. The excitation RF energy is thereby localized into the area to be scanned and preferably only that area. This allows a higher level, typically much higher, of RF excitation field intensity required by advanced fast pulse sequences. Still, however, the over-all RF exposure to the patient remains relatively small in comparison with the non-localized RF field from the large transmitter. A benefit of this aspect of the present invention is that some wrap-around artifact problems, caused by non-localized RF excitation are alleviated and typically eliminated.

Figure 5B:
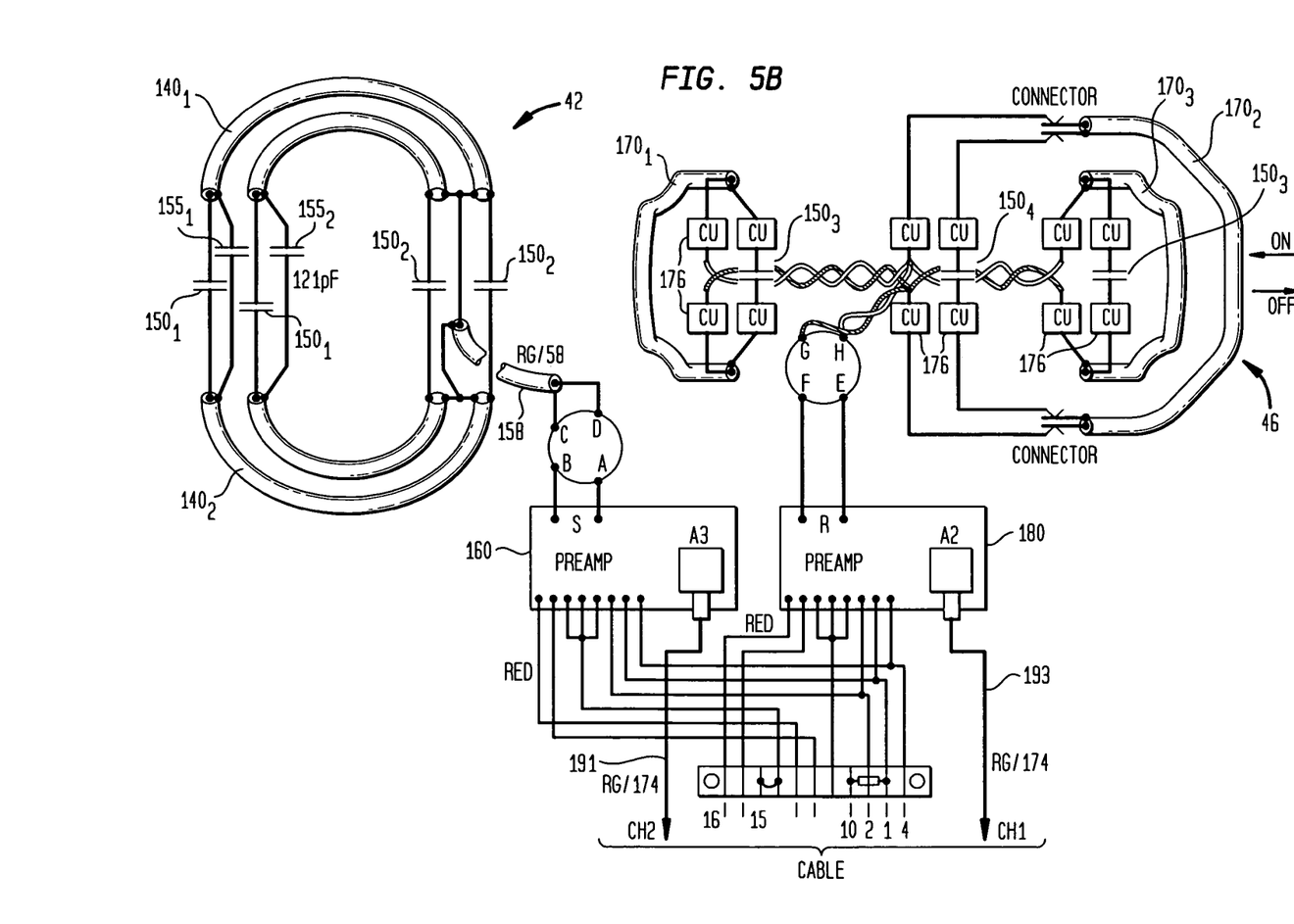
FIG. 5B illustrates a circuit diagram of a quadrature foot coil in accordance with an aspect of the present invention.

Turning now to FIG. 5B, there is shown a circuit diagram of another embodiment of a quadrature foot coil in accordance with an aspect of the present invention. More specifically, FIG. 5B is a variant of FIG. 5A. It illustrates changes in the circuitry of the foot coil of FIG. 5A. These changes may be implemented in other trans-receive system. In particular, the decoupling circuits 150 of FIG. 5A have been replaced by capacitances. In addition, the interfaces between the first coil 42 and first preamplifier 160, C,D and A,B respectively, and the second coil 46 and the second preamplifier, G,H and E,F respectively, are modified as indicated in FIG. 5C.

Figure 5C:
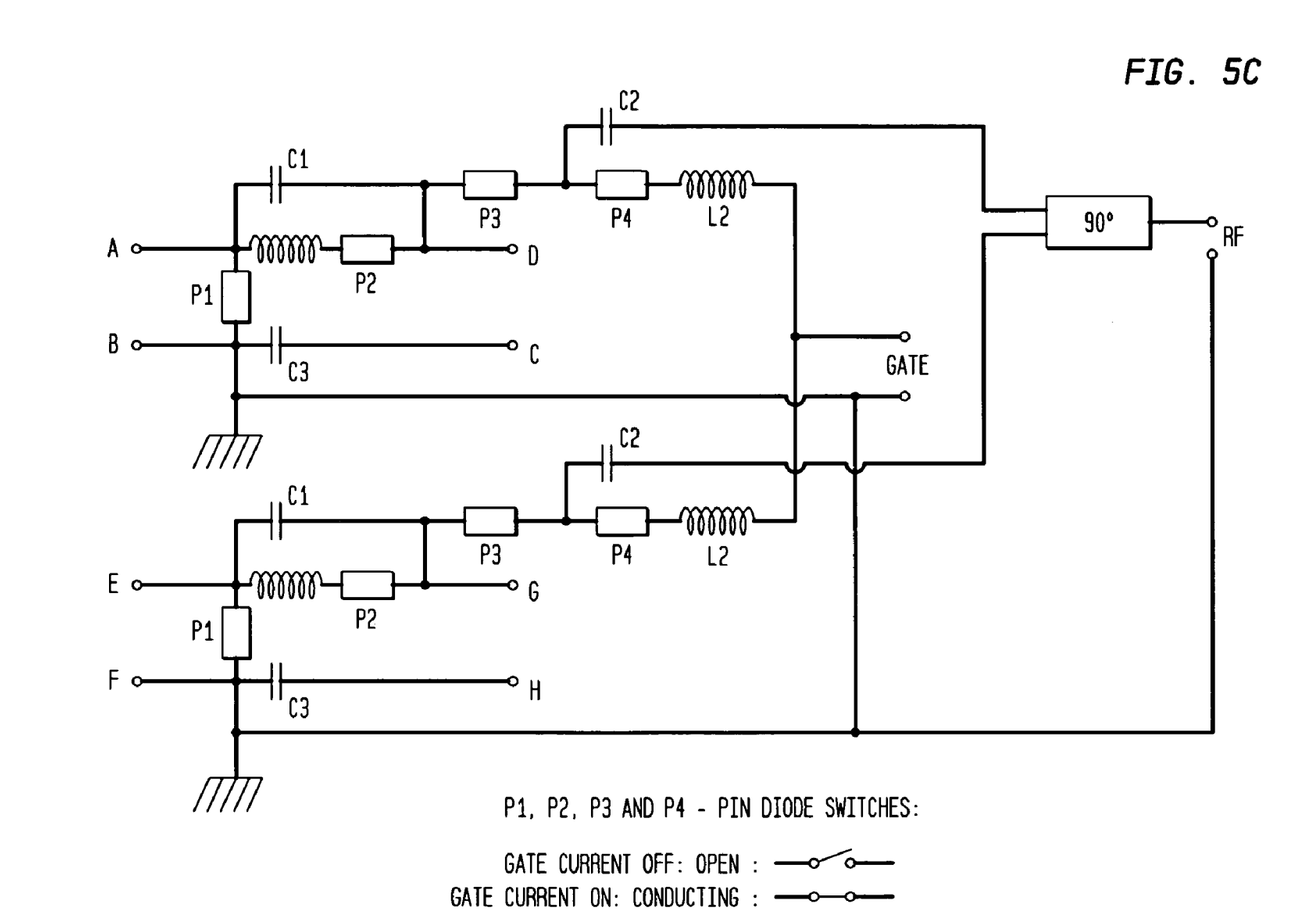
FIG. 5C illustrates a circuit diagram of a quadrature foot coil in accordance with an aspect of the present invention.

The circuit of FIG. 5C comprise the various elements shown and their connections relative to nodes A, B, C, D, E, F, G and H. This circuitry operates as follows. When RF transmitting is initiated, current pulses from the scanner computer system enter through the RF choke L2 opens (i.e., establishes conducting) the PIN diodes P1, P2, P3 and P4. The RF pulse then enters through the DC blocking capacitor C2 and PIN diodes P3 into the first and second coils at points C,D and G,H, respectively. During this excitation stage, the sensitive inputs of the first and second pre-amplifiers are protected by blocking circuits C1, L1, P2 and by the short to ground through P1.

During RF reception, the circuit operates as follows. The gate current is OFF and the NMR signal proceeds from the first and second coils into the inputs of the first and second preamplifiers through the chains D, C, C1, C3, A, B and G, H, C1, C3, E, F, respectively.

Note also that the 90° power splitter is used to generate a circularly polarized, e.g., rotating, RF field.

Although FIGS. 5A and 5B show specific capacitance values, it should be appreciated these values would change based on the field strength and coil geometry.

In view of the foregoing, a quadrature foot coil that improves the magnet resonance imaging of the foot and ankle regions is provided. If used in a magnet such as that shown in FIGS. 1, 2 and 3, images may be taken in a weight bearing and a recumbent position. Given the locality of the coil and the ability to locate it and the patient's foot in the imaging volume of the magnet better images may be obtained under various conditions. Although the foot coil 34 is described in relation to a horizontal field magnet of the type shown in FIGS. 1, 2, and 3, any other magnet geometries may also be used.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An antenna configured for magnetic resonance imaging of a patient foot, comprising:
    a planar base;
    a first coil structure mounted to the base and having first and second coil loops disposed above each other and oriented to form an opening configured for receiving the foot of the patient wherein each loop extends and forms a frame around the foot of the patient along a lengthwise direction defined by the foot, the first coil structure defining a first coil vector that is perpendicular to the lengthwise direction and substantially parallel to a longitudinal axis of the patient; and
    a second coil structure having individual first and second end sections and a middle/center section, the first and second end sections being mounted to the base proximate respective ends of the frame of the first coil structure and oriented in order to extend along a widthwise direction of the foot, the middle/center section of the second coil structure being mounted to the base between the first and second end coil sections, the second coil structure defining a second coil vector that is parallel to the lengthwise direction of the foot.

2. The antenna of claim 1, wherein the base includes an extended portion configured for supporting the patient's other foot.

3. The antenna of claim 1, wherein the first coil structure comprises one or more conductors having at least two turns disposed above each other along the direction of the first coil vector and each extending around the foot in the lengthwise direction.

4. The antenna of claim 1, wherein the second coil structure comprises one or more conductors having at least three turns, each turn being mounted to the base.

5. The antenna of claim 4, wherein at least one of the turns is detachably mounted to the base in order to allow insertion of the patient's foot into the opening.

6. The antenna of claim 4, wherein the base comprises a planar surface having a pair of lateral edges disposed opposite each other along the lengthwise direction and two of the at least three turns of the second conductor are respectively mounted proximate each of the lateral edges.

7. The antenna of claim 6, wherein a third turn is mounted on the base between the two turns mounted proximate the lateral edges.

8. The antenna of claim 7, wherein the third turn is detachably mounted to the base in order to allow insertion of the patient's foot into the opening.

9. A quadrature magnetic resonance coil antenna assembly, configured for imaging a patient's foot comprising:
    a base having a planar surface that defines a pair of lateral edges separated along an axial direction and extending in a first direction substantially perpendicular to the axial direction of the base;
    a first coil frame structure supported on the base and arranged in order to form an oval that defines an area on the surface configured for positioning a sole of a patient's foot or footwear, the first coil having first and second loop coils disposed above each other and arranged in order to form the oval and defining a first coil vector that is perpendicular to the axial direction of the base and the first direction;
    a second coil structure supported on the base, the second coil structure including a first section that is mounted on the base proximate a curved end defined by the oval proximate a first of the lateral edges, a second section that is mounted on the base proximate another curved end defined by the oval proximate a second of the lateral edges, and a third section, of the second coil structure that is mountable on the base between the first and second sections, the second coil defining a coil vector that is perpendicular to the first coil vector.

10. The antenna assembly of claim 9, wherein the first, second and third sections comprise a housing configured for one or more conductors that form the second coil.

11. The antenna assembly of claim 9, wherein the first and second sections project outward from the base and each include a curved portion that respectively extends around the heel and toe area of the patient's foot when positioned in the oval formed by the first coil.

12. The antenna assembly of claim 9, wherein the oval formed by the first coil projects outward from the surface of the base.

13. The antenna assembly of claim 9, wherein the first coil comprises a first section projecting outward from the base and a second section mounted atop the first section.

14. The antenna assembly of claim 9, wherein the first and second sections comprise a housing configured for one or more conductors that form the first coil.

15. A system configured for magnetic resonance imaging of a patient foot, comprising:
    a magnet defining a patient-receiving space and having a static magnetic field with a field vector in a substantially horizontal direction;
    a patient support positionable within the patient-receiving space and pivotable about a horizontal pivot axis that is parallel to the field vector; and
    a quadrature magnetic resonance coil antenna assembly configured for imaging the patient's foot and supported by the patient support and including (1) a base having a planar surface defining a pair of lateral edges, (2) a first coil frame structure mounted to the base and having first and second coil loops disposed above each other and oriented in order to form an opening configured for receiving a foot of a patient such that each loop extends and forms a frame around the foot along a lengthwise direction defined by the foot, the first coil frame structure having a first coil vector that is perpendicular to the field vector when the assembly and patient support are positioned in the patient-receiving space and (3) a second coil frame structure having individual first and second end sections and a middle/center section, the first and second end sections being mounted to the base proximate respective ends of the frame of the first coil structure and oriented in order to extend along a widthwise direction of the foot, the middle/center section of the second coil frame structure being mounted to the base between the first and second end coil sections, the second coil frame structure having a second coil vector that is perpendicular to the first coil vector and the field vector when the coil antenna assembly and patient support are positioned in the patient-receiving space, and wherein the first and second coils are arranged on the base to define a volume configured for a receiving a magnetic resonance signal from a patient's foot positioned on the base.

16. The system of claim 15, wherein the first and second sections project outward from the base and each include a curved portion that respectively extends around the heel and toe area of the patient's foot when positioned within the volume formed by the coils.

17. The system of claim 15, wherein the first coil frame structure comprises a first section projecting outward from the base and a second section mounted atop the first section.

18. The system of claim 17, wherein the first and second sections comprise a housing configured for one or more conductors that form the first coil.

* * * * *